United States Patent [19]

Stoklosa et al.

[11] Patent Number: 4,920,019

[45] Date of Patent: Apr. 24, 1990

[54] BATTERY PACK ASSEMBLY HAVING A CIRCUIT BOARD

[75] Inventors: David P. Stoklosa, Webster, N.Y.; Christopher S. Pedicini; Imre A. Pattantyus, both of North Olmsted, Ohio

[73] Assignee: Eveready Battery Company, Inc., St. Louis, Mich.

[21] Appl. No.: 328,550

[22] Filed: Mar. 24, 1989

[51] Int. Cl.⁵ ............................................. H01M 2/22
[52] U.S. Cl. .................................... 429/122; 429/158; 429/160
[58] Field of Search .............................. 429/121–123, 429/158, 160, 178; 136/293; 361/358, 380, 397, 426; 174/68.5; 439/709

[56] References Cited

U.S. PATENT DOCUMENTS 3,990,142  11/1976  Weglin .................................. 29/625

FOREIGN PATENT DOCUMENTS 0808396   10/1981  France .
78-76368   7/1978  Japan .
58-202586 11/1983  Japan .
58-202587 11/1983  Japan .
85-57698   4/1985  Japan .
61-255851 11/1986  Japan .
62-140495  6/1987  Japan .
1259837    1/1972  United Kingdom .

Primary Examiner—Anthony Skapars
Attorney, Agent, or Firm—Price, Heneveld, Cooper, DeWitt & Litton

[57] ABSTRACT

A novel circuit board and method of fabricating such, and a novel combination of a circuit board with batteries in a battery pack and assembly method are disclosed herein. The circuit board is connectable by welding or soldering of integral tabs of the circuit board metal layer to the battery terminals. The circuit board includes at least one, and preferably two, insulator sheets and a metal layer laminated between the insulator sheets in sandwich fashion. The metal layer has integral tabs extending in pairs into openings of the metal sheet, coincident with openings in the insulator sheets. The tabs are generally coplanar with the remainder of the metal sheet and readily accessible, for example, by a spot welder, through the openings. The metal and insulator components to form the circuit board are aligned with each other. The laminted board assembly is post-punched to remove sections of the metal layer, along with corresponding sections of the insulator sheets, to result in the desired circuitry.

8 Claims, 2 Drawing Sheets

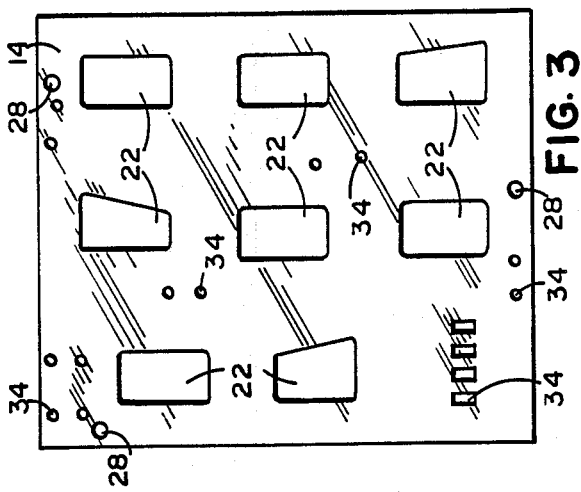
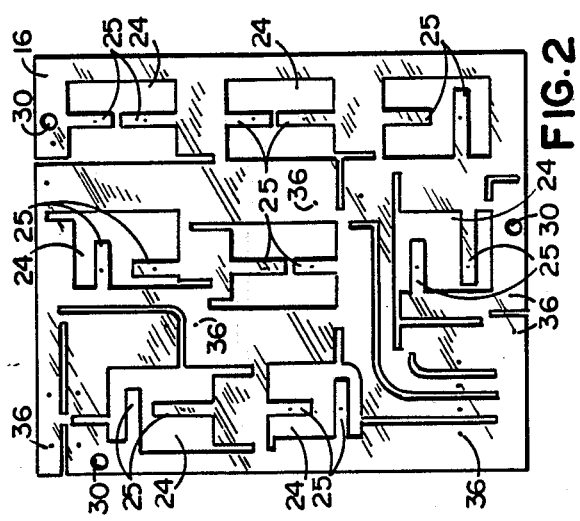
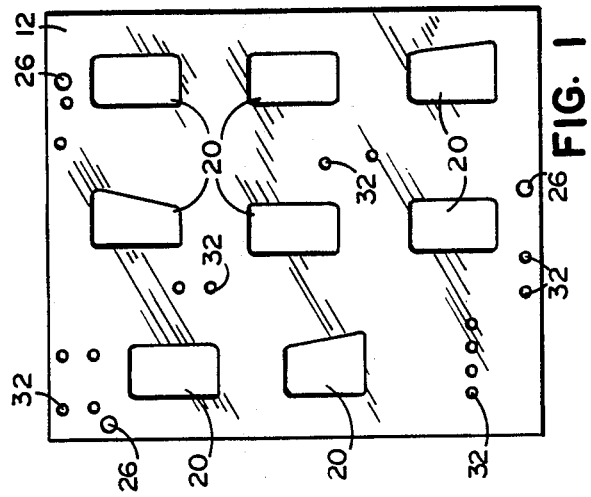

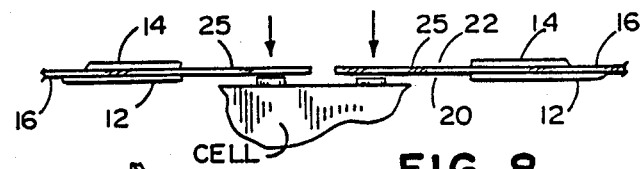
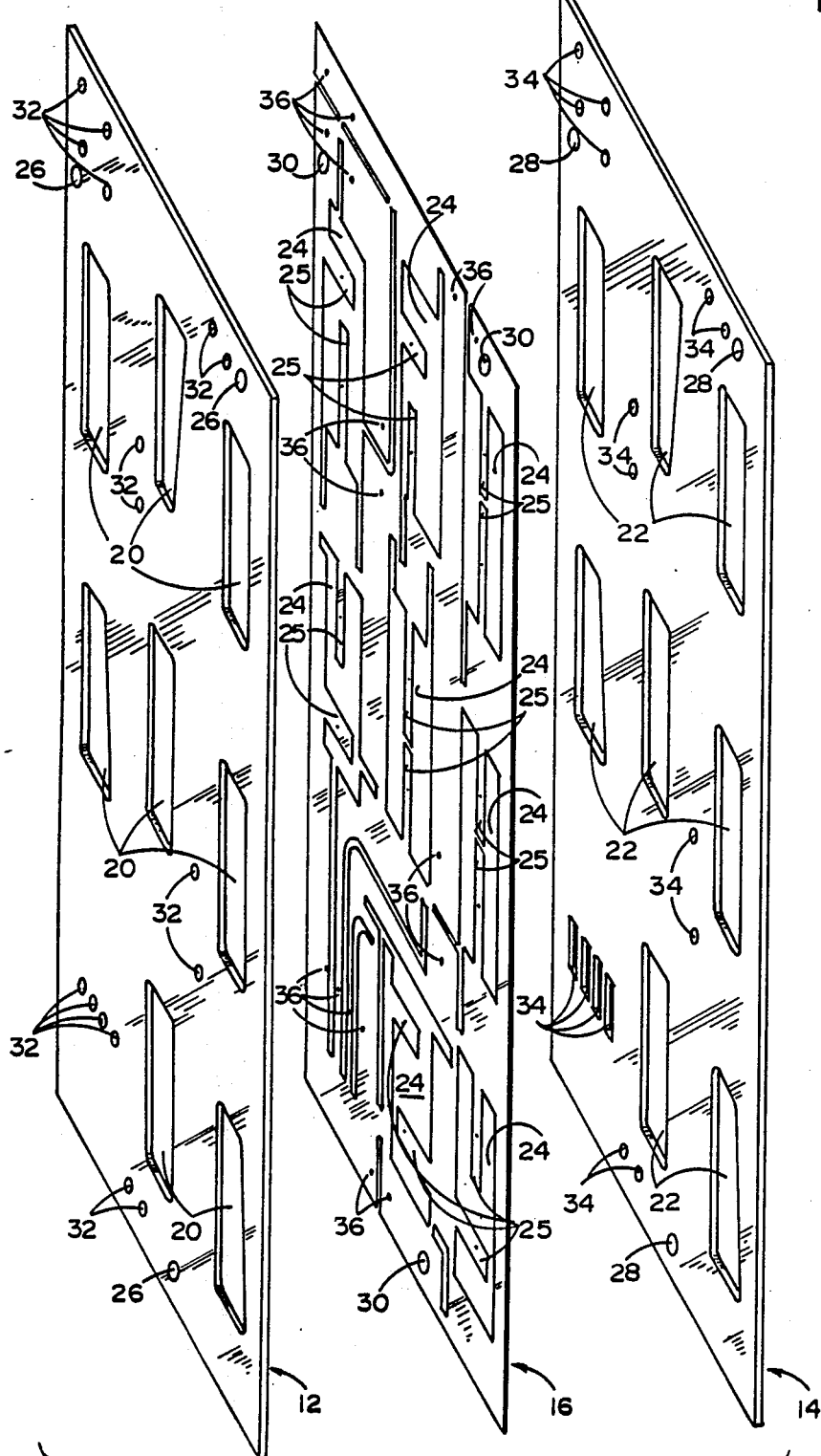
FIG. 8
FIG. 4

BATTERY PACK ASSEMBLY HAVING A CIRCUIT BOARD

BACKGROUND OF THE INVENTION

This invention relates to a laminated circuit board, the method of making it, and the combination thereof with galvanic cells, i.e. batteries, to form a battery pack.

Battery packs are presently made by grouping a plurality of cells, positioning a common circuit board adjacent the terminals of the cells, and hand soldering to each terminal and to a portion of the circuit board a lead element such as a wire. Each cell must be individually pretabbed, i.e., it must have two conductive leads attached by soldering or otherwise, one from the positive terminal or site and one from the negative terminal or site. The method is highly labor intensive, tedious, meticulous, time consuming and expensive, with resulting quality dependent on the skill and care of the laborer.

SUMMARY OF THE INVENTION

This invention provides a novel circuit board and method of fabricating such, and a novel combination of a circuit board with batteries in a battery pack resulting from the assembly method. The circuit board is connectable by welding, e.g., "spot" welding, soldering, percussion welding or the like of integral tabs on the circuit board metal layer to the battery terminals. No added leads are required. Tedious hand labor is not necessary. Assembly is possible with automated equipment within a small fraction of the previously required time.

The circuit board includes at least one, and preferably two, preperforated insulator sheets and a preperforated, freestanding metal layer laminated between the insulator sheets in sandwich fashion. The metal layer has integral tabs extending in pairs into preperforated openings of the metal sheet, coincident with openings in the insulator sheets, generally coplanar with the remainder of the metal sheet and readily accessible, for example by a spot welder, through the openings, to be secured in electrically conductive engagement to the battery terminals.

The metal and insulator components to form the circuit board are aligned with each other by use of alignment orifices cooperable with alignment protrusions, usually pins. The laminated board assembly is postpunched to remove sections of the metal layer, along with corresponding sections of the insulator sheets, to result in the desired circuitry.

The method involves preworking, specifically preperforating, the two insulator sheets with a plurality of openings, preperforating the metal layer with corresponding openings while leaving pairs of integral, generally coplanar tabs to protrude into said coincident openings and overlie terminals of a plurality of galvanic cells. The preperforating also preferably forms alignment holes for the sheets and layer, and preferably connector orifices. The sheets and layer are laminated in sandwich fashion and postpunched to remove selected portions of the metal layer as well as of both sheets, to form desired circuitry, and placed on a group of cells. The metal tabs are then secured, as by spot welding, to the terminals of the cells.

These and other objects, advantages and features of the invention will become apparent upon studying the following specific disclosure of the preferred embodiment, in conjunction with the drawings.

BRIEF DESCRIPTION OF THE DRAWINGS

FIG. 1 is a plan view of one, namely the bottom, insulator sheet of the circuit board;

FIG. 2 is a plan view of the metal layer of the circuit board;

FIG. 3 is a plan view of the second, namely top, insulator sheet of the circuit board;

FIG. 4 is an exploded perspective view of the three sheets in aligned but spaced relationship prior to forming a composite thereof;

FIG. 5 is a plan view of the two insulator sheets and the metal layer laminated together into a composite structure;

FIG. 6 is a plan view of a postpunching die;

FIG. 7 is a plan view of the assembled circuit board after the postpunching operation; and FIG. 8 is a fragmentary enlarged side elevational view of a portion of the circuit board to be secured to the respective terminals of an underlying battery.

DESCRIPTION OF THE PREFERRED EMBODIMENT

Referring now specifically to the drawings, Figs. 1, 2 and 3 depict three layer components to be combined according to the novel teachings. The layers as combined are depicted in FIG. 5. The laminated circuit board 10 is formed of lower insulation sheet 12 (FIG. 1) and upper insulation sheet 14 (FIG. 3) of conventional electrically nonconductive material, and an intermediate metal foil layer 16, as of nickel, therebetween. Each of these three layers is preperforated before assembly in particular correlated patterns.

The terms used herein are intended to mean the following.

"Preperforate" means the preworking prior to assembly of an individual sheet or layer to form holes or openings therethrough. The preferred specific method is prepunching. This can alternatively be achieved by stamping, wire cutting, etching, electrical discharge machinery or the like, and if the insulation sheets are polymeric, by molding or vacuum forming.

"Laminate" means to secure the materials in tightly engaging relationship. The preferred method presently is bonding by adhering the layers together with an adhesive and/or by heat and/or pressure bonding. This can alternatively be achieved by a mechanical securement such as by snap engagement of small protrusions formed into the insulation sheets into cooperative holes in the metal layer.

"Insulator sheet" means electrically nonconductive material, preferably freestanding/self-supporting, of polymeric material with or without reinforcement material therein, or treated cellulosic material or other known insulation materials. In a less preferred embodiment, these can be of film stock as explained hereinafter.

"Welding" means the integral joining of metal components together as by any of various known techniques including resistance welding, spot welding, brazing including soldering, percussion welding and the like.

As shown, lower insulation sheet 12 is formed with a plurality of clearance openings 20, a series of alignment holes 26, and a set of connection orifices 32, preferably by prepunching.

Clearance openings 20 are of a size and configuration to fit over the top of the terminals of a series of galvanic cells or batteries, here eight in number. Thus there are eight openings 20 generally rectangular in configuration and large enough to extend around the periphery of the two terminals, positive and negative, of each battery. A like configured and like number of openings 22 are formed into upper insulation sheet 14, preferably by prepunching, such that when sheet 14 and sheet 12 are placed in alignment one with the other, corresponding openings 20 and 22 will coincide.

A series of small alignment holes 26, preferably at least two in number, are also formed in insulation sheet 12. These holes may be located, for example, near the edges of sheet 12. These holes coincide with two or more like holes 28 in sheet 14, located in the same pattern and of the same size. When the two sheets are placed one upon the other, the three holes in each sheet coincide to receive alignment pins. These pins (not shown) can be used to cause these sheets to be in alignment. Alternatively, two or more protrusions (not depicted) could be formed into the insulation sheets, as by molding or vacuum forming, to fit into like positioned holes in the intermediate metal layer for alignment and, if desired, securement therewith.

A third set of connection orifices is provided in both sheets, preferably by prepunching. These openings are smaller in lower sheet 12 than in upper sheet 14, but coincident therewith. Such orifices are shown in patterns of four or two in number on both sheets. The smaller orifices 32 in sheet 12 coincide with the slightly larger orifices 34 in sheet 14. The purpose of these orifices is to allow electrical connection between the metal foil and overlying components in the battery pack to be assembled. This can be done by extending a connecting member (not shown), such as a wire lead of an electronic component, through the metal, and soldering it in place.

Metal foil layer 16 also is preperforated, preferably taking care to cause the final layer to maintain its integrity as a unitary item prior to assembly to the two insulator sheets. This is done in a manner to provide openings 24 corresponding in number and location to openings 20 and 22 in the insulator sheets, but specifically leaving integral electrical connector tabs in the foil layer projecting into openings 24. More specifically, referring to FIG. 2, foil layer 16 is processed to have the eight openings 24 somewhat larger in size than openings 20 and 22, but generally corresponding thereto in location. Each of openings 24 has projecting thereinto a pair of tabs 25 integral with the metal foil layer and coplanar therewith. These tabs are shown to project into the openings at various desired angular arrangements, e.g. at 90 degrees as in the lower right-hand corner, at 180 degrees aligned with each other as in the center or the upper right-hand corner, and at 180 degrees offset from each other as in the lower center portion of layer 16. Various other geometrical slots may be formed into the metal layer as depicted in FIG. 2 to enable postpunching operation to be minimized, yet taking care to cause the metal foil to remain in one integral mechanical piece for effective manipulation thereof and alignment with the insulator sheets. Assisting in this alignment is a set of three openings 30 in layer 16 coinciding with holes 26 and 28 in insulator sheets 12 and 14 when the three are overlaid. Also formed in metal layer 16, in the same pattern as orifices 32 and 34 in sheets 12 and 14, is a series of orifices 36 to be used in a manner explained hereinafter.

The three components 12, 14 and 16 are then assembled together to laminate the components. This may be done, for example, by coating the mating surfaces thereof with a suitable electrically nonconductive adhesive such as a typical epoxy based adhesive or the equivalent, to bond the three layers into one integral structure depicted at 40 in FIG. 5.

It is now only necessary to conduct a postpunching operation on the three laminated layers forming the board. There is more than one advantage to this postpunching operation. The main purpose is to cut out portions of the metal layer to separate the foil into the discreet desired circuit components. This postpunching operation removes not only the portions of the metal layer but also the overlying and underlying corresponding portions of the insulator sheets as the punch die slices through all three layers. The particular punching pattern will vary with the desired final circuits to be created. It is no longer necessary to keep the metal layer in a condition of integrity as a unitary member since it is supported by and maintained by the insulation sheets. A representative pattern is illustrated by the die in FIG. 6. That is, the die 50 depicted in FIG. 6 has cylindrical protrusions 52 with sharp edges to cut the pattern there shown and also shown by the resulting orifices 60 in the postpunched board in FIG. 7. Another advantage of the postpunching operation is to provide space for certain components of the battery pack to project through the circuit board. That is, certain components of the battery pack such as traces for circuitry (not shown) can project upwardly through some of these openings, while others of the openings receive integral nibs formed on the lid (not shown) of the battery pack and protruding down into the openings as for alignment thereon.

This completed laminated circuit board is employed to form a battery pack assembly by combining it with a series of, in this instance eight, galvanic cells or batteries. More specifically, the plurality of cells are arranged in a pattern or grouping such that, when the circuit board is placed thereon, each pair of tabs 25 overlies the respective negative and positive terminals or posts of the battery adjacent thereto as illustratively depicted in FIG. 8. Then, by applying to the tabs a deflecting biasing force (indicated by the arrows in FIG. 8), e.g., with resistance welder terminals (not shown), the tabs will be bent slightly to engage the battery terminals and secured, e.g., preferably spot welded, to the battery terminals to physically secure them to each other and for electrical conductance therebetween.

In addition, other electrical components can be electrically connected to the circuit portions of the metal layer by extending connector elements through orifices 32 and pressing them through orifices 36 to form a friction fit with the metal layer, and soldering the elements to the metal layer or foil.

If desired, one of the insulator sheets may be of a heat conductive material such as silicone rubber, to assist in dissipation of heat generated by the cells.

A number of advantages can result from this invention, including the following:

(1) No individual cell pretabbing is required.

(2) Specific cell orientation within the battery case is not required.

(3) Placement of the board becomes much less cumbersome (i.e., no interference from tabs protruding up from the cells).

(4) This board will permit the use of a fully automatic machine (e.g., X-Y spot welding table) to make the final electrical connections, resulting in both increased speed and improved safety during battery assembly.

(5) Substitution of spot welding for soldering for the electrical connections is faster and further eliminates the additional height taken up by the solder "beads" on the top side of the board and thus permits some decrease in overall battery height or increase in unit cell height. In the latter instance, active material content could be increased somewhat to improve overall battery performance.

(6) Discrete electronic components (diodes, etc.) could be welded (or soldered, as needed) to the board if desired. Both topside and bottomside components could be attached to the board, requiring only the one trace (current-carrying layer) instead of two.

(7) A wider variety of materials could be considered for board fabrication than is possible with conventional circuit boards.

(8) This method can be easily tailored to any desired circuit paths. Only two to three major components must be handled. Many interconnection concepts have discrete components for each circuit path; these parts are difficult to handle and require manual assembly or complicated machinery.

(9) An unlaminated section of the metal foil layer can be left extending out of the assembly for attachment to a device such as a battery. For example, these flexible extensions can be bent to accommodate the battery socket location. Thus, the wires now used between the circuit board and the battery socket could be eliminated.

(10) In contrast with prior art etched board manufacturing methods, the thickness of the current-carrying layer in the laminated assembly can be easily adjusted. Thick copper cladding on the raw board material is very expensive and etching time increases radically beyond a certain thickness. The laminated board described herein can exhibit half the impedance of a conventional circuit board, thereby improving overall battery performance.

(11) The method of this invention as taught in the preferred embodiment (i.e., with a prepunched metal layer), provides a very rapid means of fabricating circuit boards, in contrast to slower processes involving etching of a metal layer.

(12) Battery assembly speed could be increased by as much as 400% with this new circuit board. In addition, the metal foil and the flexible plastic layers could be delivered from a reel in registered fashion and severed from the spool after lamination. This could easily be handled with simple automatic machinery.

In another technique, the insulation sheets could conceivably be thin polymeric films which are not freestanding, but are supported by the metal layer. The sheets would not be prepunched or cut. The metal layer would be preperforated as by punching. The polymeric film sheets, not preperforated, are laminated to the metal layer as by spot heat sealing. Postpunching would then remove desired areas of all three layers, as well as selective removal of only the plastic layer in certain areas, e.g., where the formed metal tabs are located. This selective removal could be accomplished as by careful depth control of a die cutting operation to cut the plastic and not the underlying metal layer in those areas. The plastic should not be sealed to the metal in those areas to insure removal of the plastic without damage to the underlying metal tabs. The result is a very thin flexible circuit board.

Conceivably, certain details of construction could be altered without departing from the inventive concept presented. Hence, the invention is intended to be limited only by the scope of the appended claims and the reasonable equivalents thereto.

The embodiments of the invention in which an exclusive property or privilege is claimed are defined as follows:

1. A battery pack assembly comprising:
   at least one galvanic cell having a pair of terminals;
   a circuit board over said terminals, said circuit board including at least one insulator sheet adjacent said cell, having an opening at said terminals, and including a thin metal layer preperforated to form a pattern, said pattern including an opening at said terminals and a pair of integral metal tabs generally coplanar with the remainder of said metal sheet and extending into said openings to lie adjacent said terminals;
   said insulator sheet and metal layer being laminated together; and
   said tabs being secured to said terminals for electrical conductance.

2. The battery pack assembly in claim 1 wherein:
   said circuit board includes said one insulator sheet and a second preperforated insulator sheet with a pattern comparable to said one sheet, said sheets being astraddle said metal layer in sandwich fashion and laminated together.

3. The assembly in claim 2 wherein said tabs are welded to the terminals.

4. A circuit board as for attachment to the terminals of a plurality of galvanic cells, comprising:
   at least one insulator sheet having openings therethrough,
   a thin metal layer having openings forming a circuit pattern and pairs of connector tabs extending into said metal layer openings, said tabs being extended integral portions of said metal layer generally coplanar with the remainder of said metal layer; and
   said metal layer being secured to said insulator sheet, and said openings of said insulator sheet being coincident with said metal sheet openings and said pairs of tabs, enabling said pairs of tabs to be connected to terminals.

5. The circuit board as defined in claim 4 including a second insulator sheet, said second insulator sheet and said one insulator sheet being astraddle of and laminated to said metal layer in sandwich fashion, said insulator sheets having matching openings astraddle said connector tabs.

6. The circuit board in claim 5 including at least two matching alignment holes through both of said insulator sheets and said metal layer, whereby said sheets and layer may be accurately aligned with each other as by pins placed through said holes.

7. The circuit board in claim 5 including matching connection orifices in said insulator sheets and corresponding locations on said metal layer, whereby connectors may be extended through said orifices and through said layer for electrical connection.

8. The circuit board in claim 5 wherein said insulator sheets are mechanically laminated to said metal layer.

* * * * *